United States Patent [19]

Kuhl

[11] 3,715,630

[45] Feb. 6, 1973

[54] ELECTRONIC CHASSIS FRAME ASSEMBLY WITH CABLING FOR PRINTED CIRCUIT BOARDS

[75] Inventor: Virgil F. Kuhl, Addison, Ill.

[73] Assignee: Motorola, Inc., Franklin Park, Ill.

[22] Filed: March 26, 1971

[21] Appl. No.: 128,451

[52] U.S. Cl. ....................317/122, 211/41, 317/118

[51] Int. Cl. ....................H02b 1/04

[58] Field of Search..317/99, 101 R, 101 D, 101 DH, 317/117, 118, 120, 122; 211/41

[56] References Cited

UNITED STATES PATENTS

| | | | |
|---|---|---|---|
| 3,404,785 | 10/1968 | Emary | 211/41 X |
| 3,184,645 | 5/1965 | Schaeffer | 317/101 D |
| 2,614,157 | 10/1952 | Montgomery | 317/99 |
| 3,539,879 | 11/1970 | Bradley | 317/101 DH |
| 3,602,774 | 8/1971 | Grant | 317/99 |
| 2,881,940 | 4/1959 | Hamilton | 317/118 |

FOREIGN PATENTS OR APPLICATIONS

| | | | |
|---|---|---|---|
| 37,653 | 4/1965 | Germany | 317/101 DH |

*Primary Examiner*—H. O. Jones
*Assistant Examiner*—Gerald P. Tolin
*Attorney*—Mueller & Aichele

[57] ABSTRACT

A frame assembly for supporting an electronic chassis includes a main frame having spaced apart side members and spaced apart end members forming a rectangularly shaped base having an open top and bottom. A second portion of the frame assembly includes a second open rectangle which is greater in at least one dimension than the first rectangle and is mounted on the main frame. Cable guiding cutouts are provided on one of the side members of the main frame and connector apertures are formed on the other side member of the main frame to facilitate the guiding and interconnection of cables extending below an electronic chassis supported by the second portion of the frame assembly. In addition a circuit board holding member facilitates mounting and holding circuit boards on the chassis in substantially perpendicular relationship to it.

8 Claims, 9 Drawing Figures

INVENTOR
VIRGIL F. KUHL

BY Mueller & Aichele
ATTORNEYS

ELECTRONIC CHASSIS FRAME ASSEMBLY WITH CABLING FOR PRINTED CIRCUIT BOARDS

BACKGROUND OF THE INVENTION

In the manufacture of electronic devices, such as tape players and the like, where a number of electronic circuits are employed to interrelate with and to operate an electro-mechanical apparatus such as a tape deck or film player, it is desirable to provide an assembly which permits independent manufacture and testing of the electronic and electro-mechanical portions of the device prior to final assembly. Then, if a failure or a fault occurs in one or the other of these different portions of the device, repair or replacement of components may be made only in the portion having such a fault prior to final assembly of the device.

It is desirable to manufacture the electronic components on a subchassis devoted exclusively to such subcomponents and to separately manufacture the electro-mechanical portions of the tape or film deck on a second subchassis devoted exclusively to the components necessary to operate the deck. Terminals on wiring cables in each of the subchassis then could be used for testing the subchassis components independently of one another, and these terminals could be interconnected in a final assembly step to form the completed device including both electronic and electro-mechanical components.

SUMMARY OF THE INVENTION

Accordingly, it is an object of this invention to provide an improved chassis for electrical components.

It is another object of this invention to provide an improved chassis frame providing cable guide and cable connecting apertures facilitating the interconnecting of components mounted on a subchassis.

It is an additional object of this invention to provide an improved circuit board mounting device for facilitating the mounting of printed circuit boards on an electronic chassis.

In accordance with a preferred embodiment of this invention, a chassis frame base supports a subchassis on which components are mounted. The chassis frame base includes a pair of elongated spaced-apart side members and a pair of elongated spaced-apart end members attached together to form an open rectangle upon which the subchassis is mounted. The subchassis extends beyond the rectangle enclosed by the frame base and has a wiring cable extending from beneath the subchassis outside the rectangle enclosed by the frame base members. The cable is guided through a cable aperture in one of the members and terminates within the rectangle in a first connector which is placed in a connector aperture on another of the members of the chassis frame base. A second cable extends from the subchassis outside the rectangle and terminates in a second connector which mates with the first connector at the connector aperture and the connectors are interconnected and held in place at the aperture.

In a more specific embodiment of the invention, the subchassis includes circuit board holders for mounting and holding circuit boards on the subchassis in a perpendicular relationship to the subchassis. The circuit board holders include a pair of spaced-apart resilient members each made of an elongated rectangular-shaped piece of spring material, the upper end of which is bent inwardly to define a circuit board gripping portion and then is bent outwardly again at an upward angle to define a camming surface. The space between the innermost facing portions of the resilient members is less than the width of a circuit board to be mounted therebetween. Slots are provided in this portion of each of the resilient members to permit the upper edge of the circuit boards to pass through the slots, so that the camming surface of each of the circuit board holders extends over the top of the circuit boards to hold the circuit boards in place once they have been fully inserted between the members.

DETAILED DESCRIPTION

Figure 2:
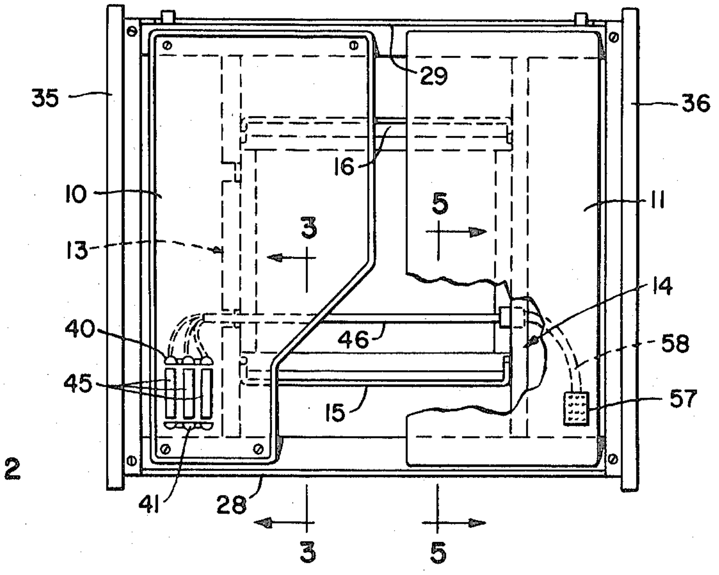
FIG. 2 is a top view of an assembled chassis of the type shown in FIG. 1.

Referring now to the drawings, wherein like reference numbers are used throughout the several Figures to denote the same or similar components, there is shown a chassis for supporting and mounting electronic or electro-mechanical components for a machine such as an electronic video recording player or the like. In order to facilitate the manufacture of such a machine in two separate parts, a first subchassis 10 carries most of the electronic components and a second subchassis 11 carries most of the electro-mechanical components for a film or tape deck. For example, the subchassis 10 could be used to mount and interconnect the electronic components with one another, whereas the subchassis 11 could be used to mount the electromechanical portions of a film player, such as the film drive mechanism, the pushbutton control mechanism, etc, with interconnections of the components within each of these subassemblies being made directly on the subchassis 10 and 11.

After the subchassis 10 and 11 have been fully independently tested, they can be mounted on a main chassis frame and interconnected by means of interconnecting cables to form a complete operative machine. To accomplish this, the main frame includes a first rectangular frame base having a pair of side frame members 13 and 14, respectively, which are spaced apart and interconnected by a pair of similar end frame members 15 and 16.

Figure 3:
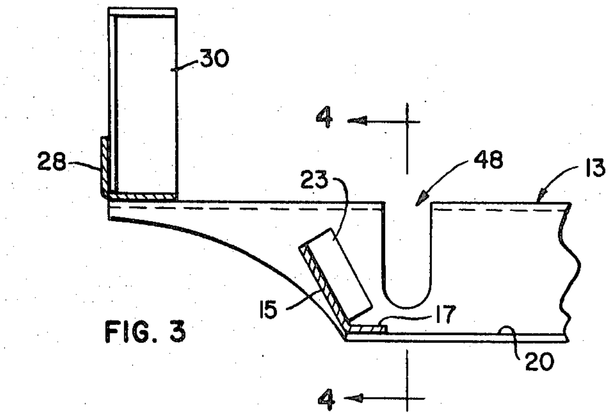
FIGS. 3 and 4 show details of one of the side members of the chassis shown in FIG. 1.
Figure 5:
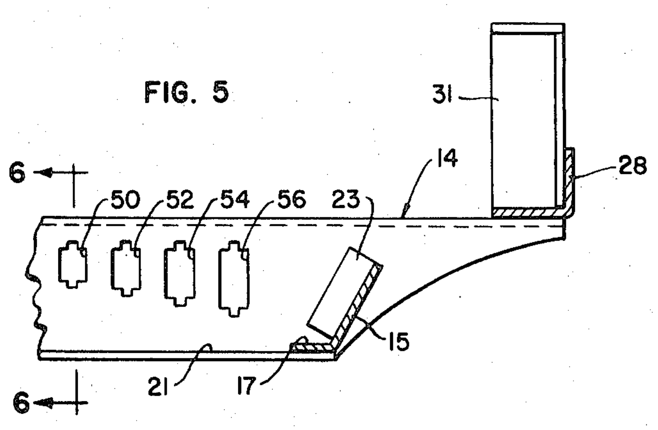
FIGS. 5 and 6 show details of another of the side members of the chassis shown in FIG. 1.

To facilitate interconnection of the side frame members 13 and 14 with the end frame members 15 and 16, the end frame members are made in a substantially L-shaped cross sectional configuration, as is most clearly shown in FIGS. 3 and 5, with the lower leg 17 of the member 15 and the lower leg 18 of the member 16 resting on and attached to bottom flanges 20 and 21 of the side members 13 and 14, respectively. In addition, the ends of each of the end members 15 and 16 terminate in a connecting flange 23 which abuts and is connected to the vertical portion of the side members 13 and 14 by welding, threaded fasteners, or other suitable means. The side frame members 13 and 14 also include upper flanges 25 and 26 forming a support plane or support surfaces for a second pair of L-shaped side frame members 28 and 29 which are placed on top of the flanges 25 and 26 at opposite ends of the side members 13 and 14. The lower legs of the L-shaped side members 28 and 29 are attached to the flanges 25 and 26 in any suitable manner, and the side members 28 and 29 extend beyond the rectangle enclosed by the frame members 13, 14, 15 and 16 forming the chassis frame base.

Figure 1:
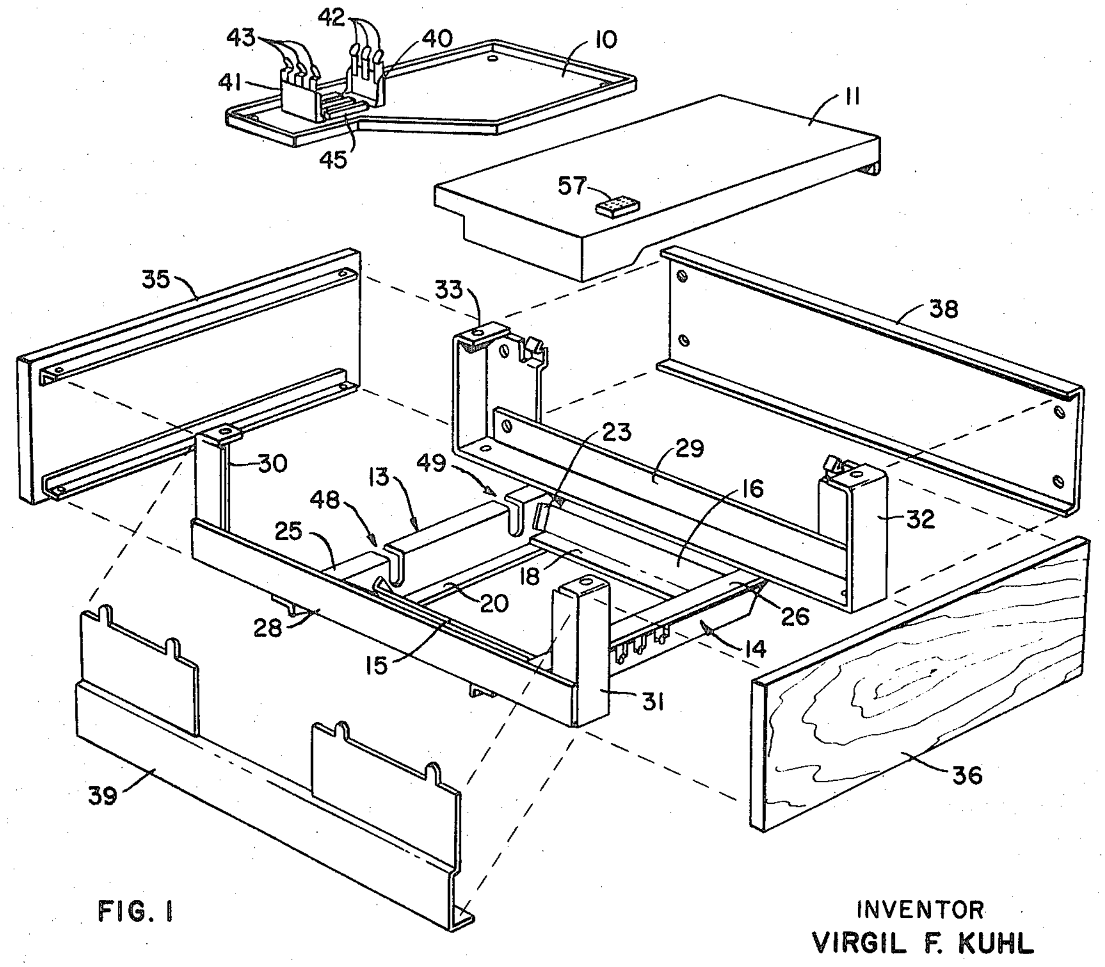
FIG. 1 is an exploded view of a chassis in accordance with a preferred embodiment of the invention.

At each of the ends of the side frame members 28 and 29, there is an upstanding corner support post 30, 31, 32 and 33. The chassis frame base is completed by attaching a pair of end plates or sides 35 and 36 to the corner support posts 30, 33 and 31, 32, respectively, and by attaching a back 38 and a front 39 to the support posts 32, 33 and 30, 31, respectively. The manner of attaching the sides 35 and the back 38 and front 39 is shown in FIG. 1 by providing L-shaped flange members on the sides 35 and 36 and the front 39 with mounting holes which cooperate with and correspond to similar mounting holes in the tops and bottoms of the corner support posts 30, 31, 32 and 33. The back 38 is shown with four mounting holes which mate with corresponding mounting holes provided in the rear support posts 32 and 33.

When the parts forming the chassis frame base shown in FIG. 1 are assembled together, the lower legs of the flanges on the frame members 28 and 29 provide support for the subchassis 10 and 11; and the side members 35 and 36, along with the back 38 and the front 39, provide a four-sided enclosure which extends above any components mounted on the subchassis 10 and 11. The subchassis 10 and 11 then may be attached to the lower legs of the frame members 28 and 29 by screws or other suitable fastening means, as shown in FIG. 2 for the subchassis 10. In the alternative, either or both of the subchassis 10 and 11 may be formed with downwardly depending portions, such as shown for the subchassis 11 in FIG. 1, to permit connection of the subchassis to the vertical portions of the frame members 28 and 29.

The upper surfaces 25 and 26 of the side frame members 13 and 14 also may serve as support surfaces located substantially beneath the center of each of the subchassis members 10 and 11, as is most clearly shown in FIG. 2. Generally, however, the subchassis 10 and 11 are made rigid enough that they do not contact the upper surfaces 25 and 26 but are spaced from these surfaces by the thickness of the lower leg of the L-shaped side members 28 and 29.

As stated previously, the subchassis 10 may be used for the mounting of the electronic components of an electronic video recording player or the like; and to provide for such mounting, a plurality of circuit board holding devices are attached to the upper surface of the subchassis 10. One set of such circuit board holding devices is shown in FIGS. 1 and 2 in the form of a pair of facing, vertically-mounted base members 40 and 41, each attached to the subchassis 10 and each carrying a set of three oppositely-aligned spring-biased circuit board holding fingers or members 42 and 43, respectively. To avoid unnecessary cluttering of the drawing, only a single pair of base members 40, 41 having three pairs of holding fingers are shown in FIGS. 1 and 2 for vertically mounting three circuit boards on the subchassis 10. It will be understood that several pairs of similar base members and the associated pairs of holding fingers would be used in an actual device. Located between the circuit board base members 40 and 41 are three circuit board connectors 45 which terminate on the lower side of the subchassis 10. These connectors 45, along with similar connectors (not shown) for other electronic components mounted on the subchassis 10, provide a means for interconnecting wiring cables or wiring harnesses to the components on the circuit boards.

Figure 4:
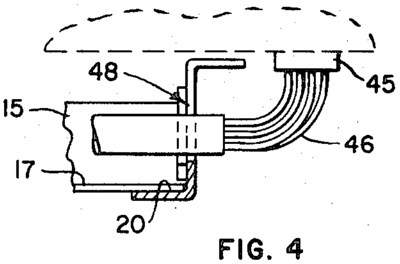

At least some of the wiring cables such as the wiring cable 46 shown in FIGS. 2 and 4, extend beneath the subchassis 10 in a region overlying an area which is outside of the rectangle defined by the base frame members 13, 14, 15 and 16. To permit interconnection of components terminating in such cables lying outside of this rectangle with components mounted on the subchassis 11 and further to provide a means for guiding and holding the cables into place when the base frame and the subchassis 10 and 11 are assembled together, a pair of cable guide apertures 48 and 49 are cut into the upper portion of the side member 13. When the subchassis 10 is mounted on the base frame by attaching it to the lower legs of the members 28 and 29, the cable 46 is guided into place into the aperture 48 where it then is captivated by the attachment of the subchassis 10 to the members 28 and 29.

Figure 6:
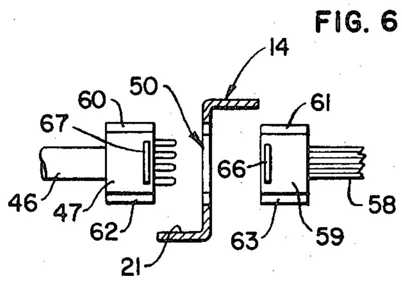

A terminal connector 47, which may be either a male or a female connector, terminates the end of the cable 46 and is located within the rectangle enclosed by the side and end frame members 13, 14, 15 and 16. As shown in FIG. 6, this terminal connector 47 is shown as a male connector for purposes of illustration. The side frame member 14 includes four different sized cable termination apertures 50, 52, 54 and 56 (best shown in FIG. 5), and different cables extending from the lower side of the subchassis 10 each terminate in a different sized end or terminal connector, corresponding in dimensions to only one of these cable termination apertures 50, 52, 54, and 56.

The subchassis 11 includes similar electrical terminals, such as the terminal 57 shown in FIGS. 1 and 2, and corresponding cables, such as the cable 58 are connected to these terminals and terminate in a mating male or female end connector. Interconnection of the mating cables is effected through the apertures 50, 52, 54 or 56, as shown most clearly in FIG. 6, in which the female end connector 59 on the cable 58 engages the male connector 47 through the aperture 50. Guide flanges 60 and 62 on the connector 47 and guide flanges 61 and 63 on the connector 59 engage correspondingly shaped cutouts in the top and bottom of the aperture 50 to vertically align the connectors 47 and 59 within the aperture and with one another. To prevent the end connectors 47 and 59 from being pulled through the aperture 50, each of the end connectors also includes one or more outwardly extending side flanges such as the flanges 66 and 67 shown from the edge in FIG. 6. These side flanges extend beyond the width of the aperture 50; so that when the connectors 47 and 59 are interconnected, the cables 46 and 58 are locked into position on the side frame member 14. Corresponding interconnections of other pairs of cables are similarly effected in the apertures 52, 54 and 56.

Figure 7:
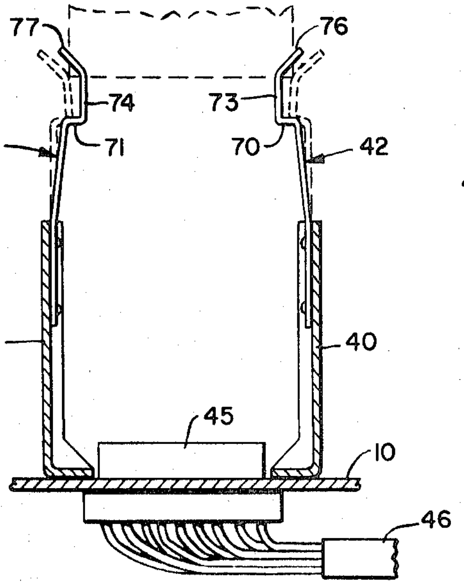
FIGS. 7, 8 and 9 show details of a circuit board holding assembly used on the chassis shown in FIGS. 1 and 2.
Figure 8:
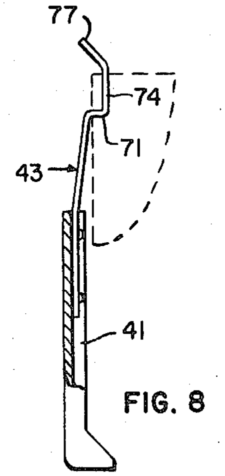
Figure 9:
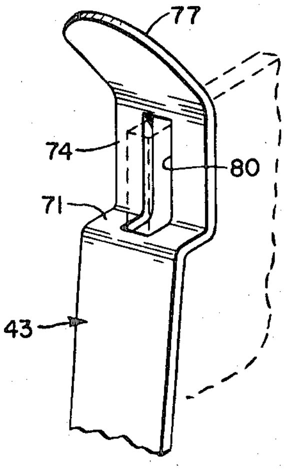

FIGS. 7, 8 and 9 show details of the circuit board base mounting members 40 and 41 and the resilient spring fingers 42 and 43. The spring fingers may be attached to the rigid base members 40 and 41 by rivots or other suitable fasteners. These spring fingers are made out of elongated rectangular-shaped pieces of spring material such as spring steel and the like, and the spacing between the members 40 and 41 permits a circuit board to pass therebetween without any interference. The upper parts of the spring fingers 42 and 43, however, each are bent inwardly toward one another to form shoulders 70 and 71, respectively. The bend which forms these shoulders is at substantially 90° to the inner surface of the spring members 42 and 43, so that the shoulders 70 and 71 are nearly parallel to the upper surface of the subchassis 10.

The shoulders 70 and 71 are terminated by a reverse bend of approximately 90° in each of the fingers 42 and 43 to form a pair of substantially vertical portions 73 and 74, with the distance between the vertical portions 73 and 74 being less than the width of a circuit board which is to be mounted between the base members 40 and 41. The vertical portions 73 and 74 end with a third outward bend in each of the spring members 42 and 43 to form a pair of upper camming surfaces 76 and 77, the tips of which are spaced apart a distance which is greater than the width of a circuit board which is to be mounted between the members.

The vertical portions 73 and 74 each are provided with a vertical slot, such as the slot 80, the finger 43 (FIG. 9). The slot 80 is slightly wider than the thickness of a circuit board. A similar slot is formed in the member 42 and is aligned with and opposite to the slot 80 in the finger 43, and these slots 80 extend substantially through the shoulders 70 and 71.

When a circuit board is forced downwardly between the fingers, it first engages the camming surfaces 76 and 77, forcing the inwardly-biased spring members 42 and 43 apart to the position shown in dotted lines in FIG. 7. Further downward movement of the circuit board causes the sides of the circuit board to engage the slots 80 at the bend between the portion 74 and the shoulder 71 and the bend between the portion 73 and the shoulder 70. Thus, the slots 80 act as a guide to facilitate location of the circuit board in proper position for engagement with the connector 45 when a circuit board is inserted between the base members 40, 41.

The height of the slots 80 in the portions 73 and 74 of the spring members 42 and 43 is chosen so that when the circuit board firmly engages the connector 45 placed between the members 40 and 41, the top of the circuit board is located just beneath the top of the slots 80. This permits the natural resiliency of the spring members 42 and 43 to return the members to the position shown in full lines in FIG. 7. In this position, the circuit board occupies the position shown in dotted lines in FIG. 9; so that the upper or flange surface 77 overlies the top of the circuit board, firmly locking it into place as shown in FIGS. 8 and 9. When it is desired to remove the circuit board for some reason, the camming surfaces 76 and 77 may be pushed apart, and the board then may be pulled out from between the spring fingers 42 and 43.

I claim:

1. A chassis for electronic components including in combination:
   a rectangular frame base including first and second side members and first and second end members and having a wiring cable guide aperture formed in at least one of said members and having a connector terminating aperture formed in at least another of said members;
   a component subchassis means supported by said frame base with at least a portion of said subchassis means overlying said frame base and at least another portion of said subchassis means overlying a region outside of said frame base;
   circuit board holding means and circuit board connector means mounted on said subchassis means, with said circuit board holding means serving to locate circuit boards in alignment with said circuit board connector means, at least one of said circuit board holding means and at least one of said circuit board connector means located on said subchassis means overlying said region outside said frame base;
   a first end connector;
   first cable means extending through said cable guide aperture and terminating in said first end connector within said frame base;
   a second end connector;
   second cable means terminating in said second end connector connected with said first end connector through said connector terminating aperture;
   means connecting one of said first and second cable means with said one circuit board connector means; and
   means connecting the other of said first and second cable means with components on said subchassis means.

2. The combination according to claim 1 wherein said circuit board holding means includes first and second spaced-apart support members extending vertically from said subchassis means, located on opposite sides of said circuit board connector means, and resiliently biased toward one another, each of said support members including a circuit board holding portion, with the distance between the circuit board holding portions of said support members being less than the width of a circuit board, a slot formed in each of said circuit board holding portions and having a width sufficient to accommodate the thickness of a circuit board.

3. The combination according to claim 2 wherein the holding portions of said support members extend a predetermined distance above a circuit board held thereby and the slots terminate at a point less than said predetermined distance above the circuit board so that the upper edge of a circuit board placed between said support members extends through the slots.

4. In a chassis structure including a subchassis means and a frame base for supporting the subchassis means, first and second connectors, and first and second wiring cables, the subchassis means having a lower surface with the first and second wiring cables extending thereacross from opposite sides and terminating in the first and second connectors, respectively, the chassis structure including in combination:

first and second elongated, spaced-apart, side frame members, each having upper and lower edges with the upper edge of the first side frame member having at least one cable guide aperture formed therein and extending into either side frame member;

first and second elongated, spaced-apart, end frame members attached between said first and second side frame members, with said side frame members and said end frame members forming a substantially rectangular chassis frame base, with at least the upper edges of said first and second side frame members having upper support surfaces thereon for supporting said subchassis means, one of said second side frame member and said end frame members having a connector terminating aperture therein;

means mounting said subchassis means on said rectangular chassis frame base, with said subchassis means substantially covering and extending beyond a rectangular opening enclosed by said frame members forming said subchassis frame base, said first wiring cable extending from said subchassis means outside the rectangular opening enclosed by said frame members and guided through said cable guide aperture, with the first connector terminating said first cable being located within the rectangular opening enclosed by said frame members; and said second wiring cable extending from said subchassis means and terminating in the second connector outside the rectangular opening enclosed by said frame members making connection with said first cable through said connector terminating aperture.

5. The combination according to claim 4 wherein said subchassis means includes first and second subchassis, said first subchassis being interconnected electrically with said second subchassis through said first and second wiring cables, respectively, said first wiring cable extending from beneath from said first subchassis and said second cable extending from beneath said second subchassis.

6. The combination according to claim 4 including a second rectangular frame having first and second upper side members supported by the upper support surfaces of said first and second side frame members with said upper side members extending beyond said rectangular chassis frame base, said second rectangular frame including first and second upper end members attached to the ends of the first and second upper side members, support flanges on at least some of said upper side and end members for supporting said subchassis means, said second rectangular frame having an open bottom permitting said wiring cables to extend therethrough.

7. The combination according to claim 4 wherein said upper support surfaces of said first and second side frame members comprise upper flanges in substantially the same plane, with said first and second side frame members extending substantially perpendicularly downwardly from said upper flanges, with the lower edges of said side frame members being a bottom flange in a plane substantially parallel to the plane of said upper flanges, with said bottom flanges providing support surfaces for interconnecting said first and second side frame members with said first and second end frame members.

8. The combination according to claim 7 wherein said first and second end frame members are substantially L-shaped members, one leg of each of which is attached to the bottom flange of each of said side frame members to form said rectangular chassis base.

* * * * *